(12) United States Patent
Iwamizu et al.

(10) Patent No.: US 10,620,650 B2
(45) Date of Patent: Apr. 14, 2020

(54) SEMICONDUCTOR DEVICE

(71) Applicant: FUJI ELECTRIC CO., LTD., Kawasaki-shi, Kanagawa (JP)

(72) Inventors: Morio Iwamizu, Matsumoto (JP); Shinji Yamashina, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/260,198

(22) Filed: Jan. 29, 2019

(65) Prior Publication Data
US 2019/0286181 A1  Sep. 19, 2019

(30) Foreign Application Priority Data

Mar. 19, 2018  (JP) .................. 2018-051160

(51) Int. Cl.
| | | |
|---|---|---|
| *G05F 1/573* | (2006.01) | |
| *H01L 27/07* | (2006.01) | |
| *H02H 5/04* | (2006.01) | |
| *H01L 29/78* | (2006.01) | |
| *H01L 27/06* | (2006.01) | |
| *H01L 27/02* | (2006.01) | |

(52) U.S. Cl.
CPC .......... *G05F 1/573* (2013.01); *H01L 27/0255* (2013.01); *H01L 27/0629* (2013.01); *H01L 27/0727* (2013.01); *H01L 29/7808* (2013.01); *H01L 29/7815* (2013.01); *H02H 5/048* (2013.01); *H01L 27/0733* (2013.01)

(58) Field of Classification Search
CPC . G05F 1/573; H01L 27/0255; H01L 27/0629; H01L 27/0727; H01L 27/0733; H01L 29/7808; H01L 29/7815; H02H 5/048

USPC ......................................................... 257/355
See application file for complete search history.

(56) References Cited

U.S. PATENT DOCUMENTS 6,087,877 A     7/2000  Gonda et al.
8,040,647 B2 * 10/2011  Logiudice ............ H02H 11/003
                                                361/84
2016/0273508 A1  9/2016  Ishii

FOREIGN PATENT DOCUMENTS

| JP | H11-032429 A | 2/1999 |
|---|---|---|
| JP | 2004-247877 A | 9/2004 |
| JP | 2008-035067 A | 2/2008 |

(Continued)

*Primary Examiner* — Tu-Tu V Ho
(74) *Attorney, Agent, or Firm* — Rabin & Berdo, P.C.

(57) ABSTRACT

A semiconductor device having an input terminal and an output terminal. The semiconductor device includes a power semiconductor element having a first main terminal connected to the output terminal, a second main terminal that is grounded and a gate terminal, and an active clamping circuit including a Zener diode and a diode connected in inverse series between the gate terminal and the first main terminal of the power semiconductor element. The semiconductor device further includes a clamp voltage switching circuit configured to switch a clamp voltage of the active clamping circuit according to a change in a voltage of the output terminal relative to the ground at a time when the power semiconductor element is turned off, the clamp voltage being switched to a first clamp voltage and a second clamp voltage, respectively, when the change in the voltage is not, and is, positive.

16 Claims, 18 Drawing Sheets

(56) References Cited

FOREIGN PATENT DOCUMENTS

| JP | 2009-232499 A | 10/2009 |
| JP | 2016-176401 A | 10/2016 |

\* cited by examiner

SEMICONDUCTOR DEVICE

CROSS-REFERENCE TO RELATED APPLICATION

This application is based upon and claims the benefit of priority of the prior Japanese Patent Application No. 2018-051160, filed on Mar. 19, 2018, the entire contents of which are incorporated herein by reference.

BACKGROUND OF THE INVENTION

1. Field of the Invention

The embodiments discussed herein are related to a semiconductor device.

2. Background of the Related Art

A one-chip semiconductor device is known as a device, of various electronic devices mounted in vehicles, which drives an inductive load in response to a control signal from an electronic control unit (ECU) (see, for example, Japanese Laid-open Patent Publication No. 2016-176401 (paragraphs [0006]-[0008], FIG. 7)).

FIG. 17 is a circuit diagram illustrative of an example of the structure of a conventional semiconductor device. FIG. 18 illustrates the operational waveforms of the semiconductor device obtained at the time of applying an active clamping circuit.

The semiconductor device illustrated in FIG. 17 includes an input terminal 101 to which a control signal is inputted, an output terminal 102 connected to a power supply (battery in the case of an inductive load mounted in a vehicle) via the inductive load, and a ground terminal 103 and is a low-side switching device. With this semiconductor device an insulated gate bipolar transistor (IGBT) is used as a power semiconductor element 104. The gate terminal of the power semiconductor element 104 is connected to the input terminal 101. The collector terminal of the power semiconductor element 104 is connected to the output terminal 102, the emitter terminal of the power semiconductor element 104 is connected to the ground terminal 103, and the sense emitter terminal of the power semiconductor element 104 is connected to the ground terminal 103 via a sense resistor 105. An active clamping circuit 106 made up of two Zener diodes connected in inverse series is connected between the collector terminal and the gate terminal of the power semiconductor element 104.

The semiconductor device includes between the input terminal 101 and the ground terminal 103 a protection diode 107, a pull-down resistor 108, an overheat detection circuit 109, a switching element 110, an overcurrent detection circuit 111, a switching element 112, and a surge protection Zener diode 113 connected in parallel. Two n-type metal-oxide-semiconductor field-effect transistors (MOSFETs) are used as the switching elements 110 and 112. All the components which make up this semiconductor device are formed on the same chip. In addition, an on signal which is inputted to the input terminal 101 and by which the power semiconductor element 104 is turned on also serves as a power source for the overheat detection circuit 109 and the overcurrent detection circuit 111. Therefore, when the power semiconductor element 104 is in an off state, the overheat detection circuit 109 and the overcurrent detection circuit 111 are in a stopped state.

When a low-level voltage VIN is inputted to the input terminal 101, the power semiconductor element 104 turns off. Accordingly, as illustrated in FIG. 18, a current IOUT does not flow. At this time a voltage VOUT of the output terminal 102 is equal to the voltage of the battery.

When a high-level voltage VIN is inputted to the input terminal 101, the power semiconductor element 104 turns on and the current IOUT flowing through the inductive load gradually increases. At this time the voltage VOUT of the output terminal 102 is approximately equal to the potential of the ground terminal 103.

Furthermore, when the high-level voltage VIN is inputted to the input terminal 101, the overheat detection circuit 109 and the overcurrent detection circuit 111 which utilize the voltage VIN as a power source begin to operate. When the overheat detection circuit 109 detects the overheated state of the power semiconductor element 104, the overheat detection circuit 109 turns on the switching element 110. By doing so, the overheat detection circuit 109 pulls down the potential of the gate terminal of the power semiconductor element 104 to turn off the power semiconductor element 104. This suppresses a rise in the temperature of the power semiconductor element 104 and prevents destruction of the power semiconductor element 104 caused by heat.

Moreover, when the high-level voltage VIN is inputted to the input terminal 101 and the overcurrent detection circuit 111 detects an overcurrent on the basis of a drop in voltage across the sense resistor 105 caused by a sense emitter current, the overcurrent detection circuit 111 turns on the switching element 112. By doing so, the potential of the gate terminal of the power semiconductor element 104 is pulled down and the power semiconductor element 104 is turned off. This prevents destruction of the power semiconductor element 104 caused by an overcurrent.

Next, when the voltage VIN inputted to the input terminal 101 becomes a low level, the power semiconductor element 104 turns off and the overheat detection circuit 109 and the overcurrent detection circuit 111 stop their operations.

On the other hand, when the power semiconductor element 104 turns off, a counter-electromotive voltage is generated across the inductive load and the voltage VOUT of the output terminal 102 becomes higher than the voltage of the battery. It is assumed that at this time the clamp voltage of the active clamping circuit 106 is, for example, 50 V. When the voltage VOUT reaches 50 V, a Zener diode of the active clamping circuit 106 breaks down. As a result, a current flows through the active clamping circuit 106 and the pull-down resistor 108. When a gate voltage is generated at the gate terminal of the power semiconductor element 104, the power semiconductor element 104 turns on and energy generated by the inductive load flows through the collector and emitter of the power semiconductor element 104. When the active clamping circuit 106 operates, the voltage VOUT of the output terminal 102 is clamped at 50 V in this way and does not become higher than 50 V. This prevents destruction of the power semiconductor element 104. This means that the clamp voltage of the active clamping circuit 106 determines the breakdown voltage of the power semiconductor element 104.

After the energy generated by the inductive load is consumed by the power semiconductor element 104, the current IOUT does not flow through the inductive load. At this time the voltage VOUT of the output terminal 102 returns to the voltage of the battery.

With the above one-chip semiconductor device, there are cases where the power semiconductor element turns on and off in a short cycle. In those cases, time for which the power semiconductor element is kept in an on state by the active clamping circuit at the time of off-control of the power semiconductor element lengthens and the power semiconductor element generates heat. If the power semiconductor element approaches an overheated state, the overheat detection circuit operates at the time of on-control of the power semiconductor element and there is a growing possibility that the overheat detection circuit forcedly stops the on operation of the power semiconductor element. Furthermore, if once the overheat detection circuit operates, the power semiconductor element is not able to turn on even at the time of a signal for exercising on-control of the power semiconductor element being inputted until the overheated state of the power semiconductor element disappears.

SUMMARY OF THE INVENTION

According to an aspect, there is provided a semiconductor device including an input terminal, an output terminal, a ground terminal, a power semiconductor element having a first main terminal connected to the output terminal, a second main terminal connected to the ground terminal, and a gate terminal that is driven by a signal inputted to the input terminal, an active clamping circuit including a Zener diode and a diode connected in inverse series between the gate terminal and the first main terminal, and a clamp voltage switching circuit which sets, while not detecting a positive voltage change at the output terminal, a clamp voltage determined by the Zener diode of the active clamping circuit to a first clamp voltage and which sets, upon detecting the positive voltage change, the clamp voltage determined by the Zener diode to a second clamp voltage lower than the first clamp voltage.

The advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

A case where an embodiment is applied to a semiconductor device which controls an inductive load mounted in a vehicle will now be described in detail as an example with reference to the accompanying drawings. Components in the figures illustrated with the same numerals are the same. Furthermore, as long as there is no inconsistency, a plurality of embodiments may partially be combined.

First Embodiment

Figure 1:
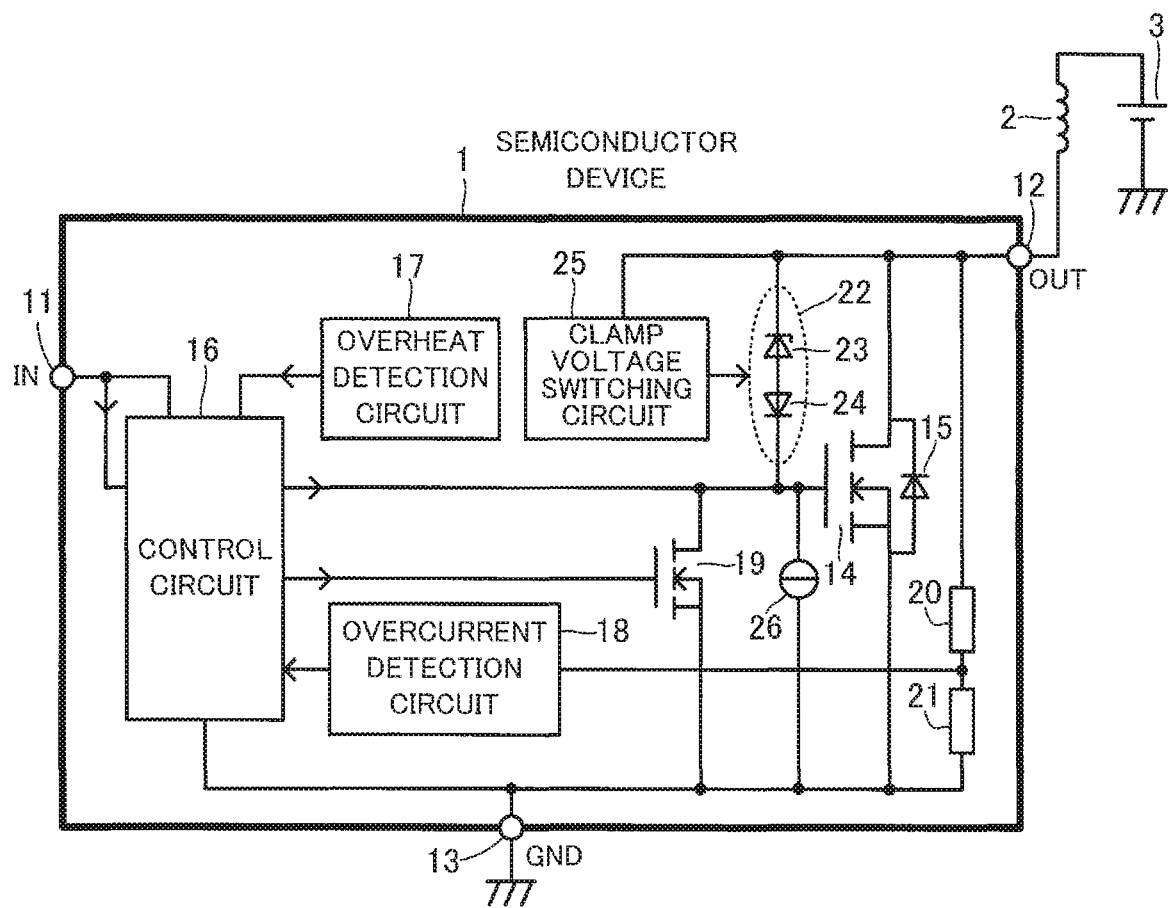
FIG. 1 is a circuit diagram illustrative of an example of the internal structure of a semiconductor device according to a first embodiment.
Figure 2:
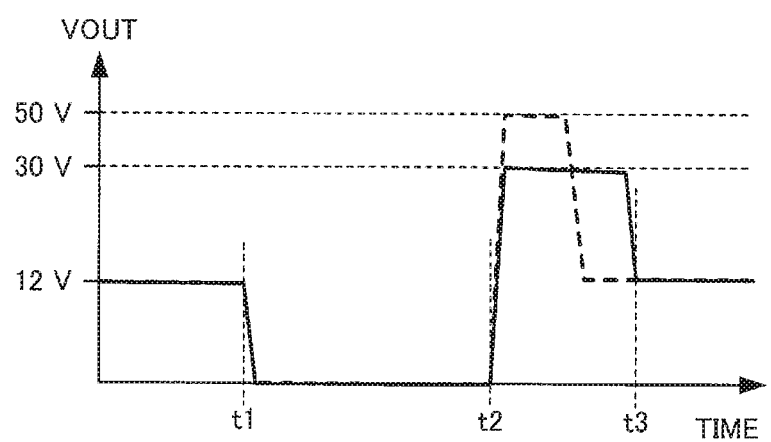
FIG. 2 illustrates a clamp voltage and the operational waveform of the semiconductor device according to the first embodiment.
Figure 3:
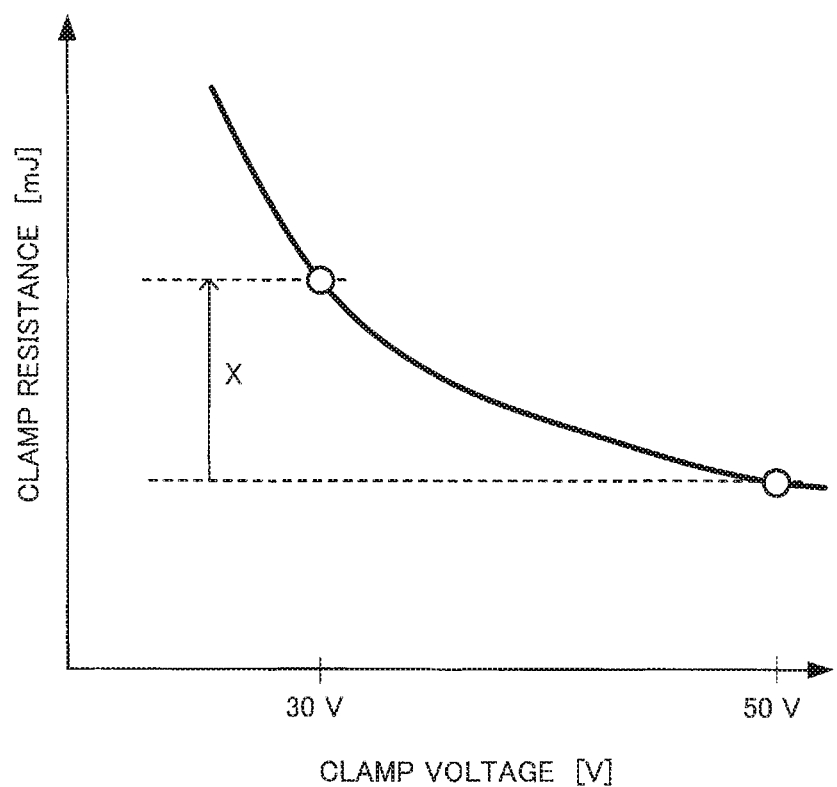
FIG. 3 illustrates the relationship between a clamp voltage and a clamp resistance.

FIG. 1 is a circuit diagram illustrative of an example of the internal structure of a semiconductor device according to a first embodiment. FIG. 2 illustrates a clamp voltage and the operational waveform of the semiconductor device according to the first embodiment. FIG. 3 illustrates the relationship between a clamp voltage and a clamp resistance.

A semiconductor device 1 according to the first embodiment includes an input terminal 11 to which a control signal is inputted from an electronic control unit mounted in a vehicle, an output terminal 12 to which one terminal of an inductive load 2 is connected, and a ground terminal 13. The other terminal of the inductive load 2 is connected to a positive electrode terminal of a battery 3 and a negative electrode terminal of the battery 3 is connected to ground to which the ground terminal 13 is connected.

The semiconductor device 1 includes a power semiconductor element 14 at the output stage. In this embodiment an n-type power MOSFET is used as the power semiconductor element 14. The drain terminal (first main terminal) of the power semiconductor element 14 is connected to the output terminal 12 and the source terminal (second main terminal) of the power semiconductor element 14 is connected to the ground terminal 13. A built-in body diode 15 is connected to the drain terminal and source terminal of the power semiconductor element 14 in inverse parallel with the power semiconductor element 14.

The gate terminal of the power semiconductor element 14 is connected to an output terminal of a control circuit 16, and an input terminal and a power source terminal of the control circuit 16 are connected to the input terminal 11. Furthermore, the control circuit 16 is connected to an output terminal of an overheat detection circuit 17, an output terminal of an overcurrent detection circuit 18, and the gate terminal of a switching element 19. The drain terminal of the switching element 19 is connected to the gate terminal of the power semiconductor element 14 and the source terminal of the switching element 19 is connected to the source terminal of the power semiconductor element 14. An input terminal of the overcurrent detection circuit 18 is connected to the common connection point of resistors 20 and 21. A terminal of the resistor 20 opposite to the common connection point is connected to the output terminal 12 and a terminal of the resistor 21 opposite to the common connection point is connected to the ground terminal 13. While the control circuit 16 outputs an on signal for the power semiconductor element 14, the overheat detection circuit 17 monitors a state in which the power semiconductor element 14 generates heat. When the overheat detection circuit 17 detects the overheated state of the power semiconductor element 14, the overheat detection circuit 17 turns on the switching element 19 to forcedly turn off the power semiconductor element 14. If the overcurrent detection circuit 18 detects, at the time of on-control of the power semiconductor element 14, an increase in voltage drop based on the on-state resistance of the power semiconductor element 14 which is caused by, for example, a short-circuit accident to the inductive load 2, then the overcurrent detection circuit 18 turns on the switching element 19 to forcedly turn off the power semiconductor element 14.

An active clamping circuit 22 is connected between the gate terminal and drain terminal of the power semiconductor element 14. In this embodiment the active clamping circuit 22 includes a Zener diode 23 and a diode 24 connected in inverse series. The cathode terminal of the Zener diode 23 is connected to the drain terminal of the power semiconductor element 14 and the cathode terminal of the diode 24 is connected to the gate terminal of the power semiconductor element 14. Because the voltage of the output terminal 12 drops to a ground level at the time of on-control of the power semiconductor element 14, the diode 24 prevents a gate voltage by which on-control of the power semiconductor element 14 is exercised from being applied to the output terminal 12 at the ground level.

A clamp voltage switching circuit 25 is connected to the active clamping circuit 22. The clamp voltage switching circuit 25 is connected to the output terminal 12 and has the function of switching the clamp voltage of the active clamping circuit 22 according to a change in the voltage of the output terminal 12 relative to the ground terminal 13 at the time of the power semiconductor element 14 turning off.

Furthermore, a constant-current element 26 is connected between the gate terminal and source terminal of the power semiconductor element 14. The constant-current element 26 has the function of pulling down an on signal of the power semiconductor element 14 and passing to the ground terminal 13 a current flowing from the output terminal 12 through the active clamping circuit 22 at the time of off-control of the power semiconductor element 14.

When a low-level voltage signal by which off-control of the power semiconductor element 14 is exercised is inputted to the input terminal 11 in the semiconductor device 1 having the above structure, the power semiconductor element 14 turns off. As illustrated in FIG. 2, at this time a voltage VOUT of the output terminal 12 is 12 V which is the voltage of the battery 3. FIG. 2 indicates that the clamp voltage of the active clamping circuit 22 is set to one of two values by the clamp voltage switching circuit 25. That is to say, 50 V is a clamp voltage (first clamp voltage) which determines the breakdown voltage of the semiconductor device 1 at a DC voltage and is lower than the breakdown voltage of the body diode 15 of the power semiconductor element 14. 30 V is a clamp voltage (second clamp voltage) which is set when the clamp voltage switching circuit 25 detects a positive abrupt voltage change (+dV/dt) at the output terminal 12.

When a high-level voltage signal is inputted at time t1 to the input terminal 11, the power semiconductor element 14 turns on and the voltage VOUT of the output terminal 12 drops to almost the ground level.

When a low-level voltage signal is inputted at time t2 to the input terminal 11, the power semiconductor element 14 turns off. As a result, a counter-electromotive voltage (surge voltage) is generated across the inductive load 2 and the voltage VOUT of the output terminal 12 leaps to a voltage obtained by adding the counter-electromotive voltage to the battery voltage. When the clamp voltage switching circuit 25 detects an abrupt change in the voltage VOUT of the output terminal 12, the clamp voltage switching circuit 25 switches the clamp voltage of the active clamping circuit 22 from 50 V to 30 V. At this time the Zener diode 23 of the active clamping circuit 22 breaks down, a current flows through the constant-current element 26, and a gate voltage is generated at the gate terminal of the power semiconductor element 14. Accordingly, the power semiconductor element 14 turns on, the voltage VOUT of the output terminal 12 is clamped at 30 V, and the counter-electromotive voltage generated by the inductive load 2 is utilized (consumed) by the power semiconductor element 14. After energy generated by the inductive load 2 is utilized by the power semiconductor element 14, the power semiconductor element 14 turns off and the voltage VOUT of the output terminal 12 becomes the battery voltage.

FIG. 2 illustrates the operational waveform of the semiconductor device 1 (see FIG. 14) obtained in the case of the clamp voltage of the active clamping circuit 22 being set 50 V by a dashed line for reference. If the clamp voltage is set in this way to a low voltage, then time taken for the power semiconductor element 14 to utilize a counter-electromotive voltage generated by the inductive load 2 becomes long. As a result, the amount of heat generated is small compared with a case where a counter-electromotive voltage is utilized in a short period of time.

As can be seen from the relationship between a clamp voltage and a clamp resistance illustrated in FIG. 3, there is a tendency for a clamp resistance at the time of driving the inductive load 2 to increase with a decrease in the clamp voltage. By decreasing the clamp voltage from 50 V to 30 V, the clamp resistance is improved by X (mJ). However, as illustrated in FIG. 2, time taken to utilize a counter-electromotive voltage becomes longer with a decrease in the clamp voltage. Accordingly, the clamp voltage is set so that the time from the time t2 to t3 will be shorter than a time for which the power semiconductor element 14 is in an off state that is realized in the case of repeatedly driving the inductive load 2 in the shortest cycle expected.

As has been described, with the semiconductor device 1 a clamp voltage (50 V) relative to a DC voltage is maintained, a clamp voltage relative to a counter-electromotive voltage is decreased (to 30 V), and a clamp resistance is increased. This reduces the amount of heat generated.

Second Embodiment

Figure 4:
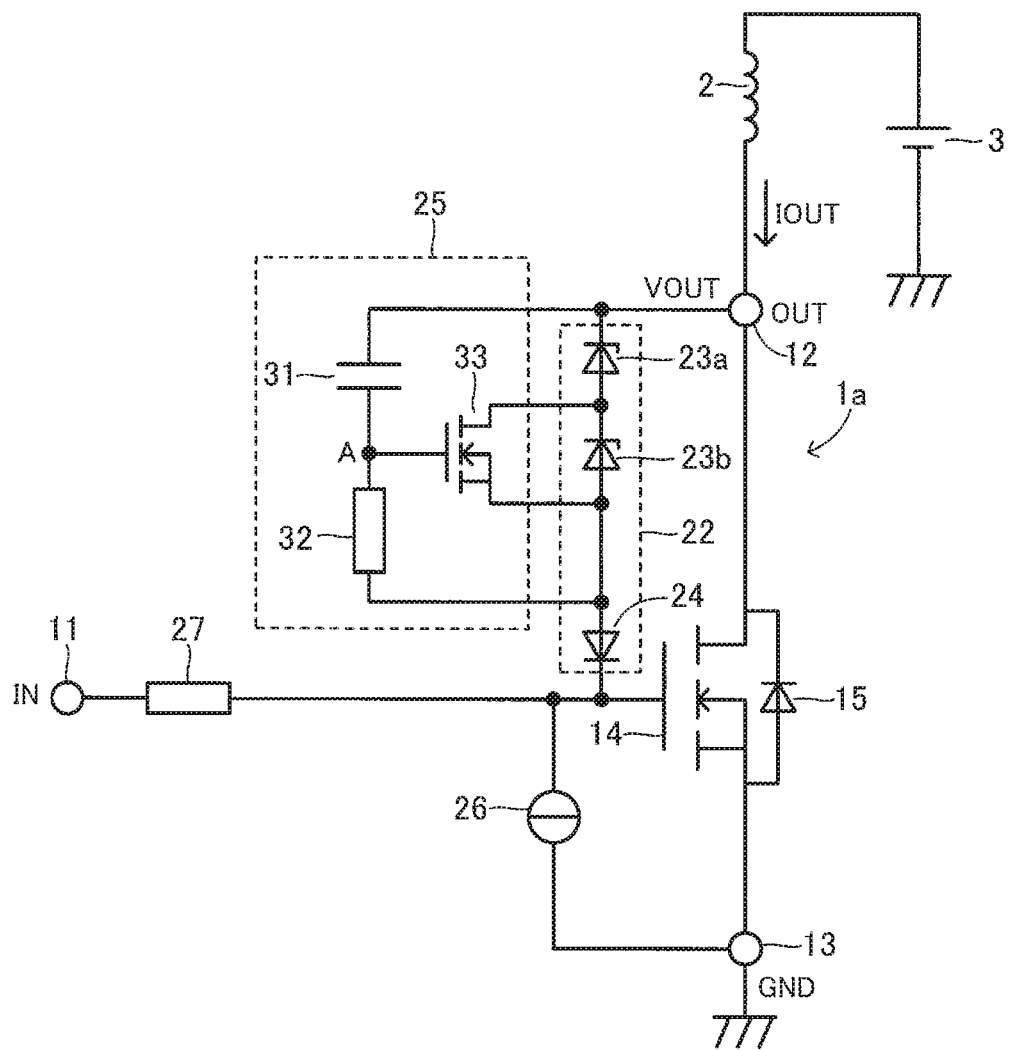
FIG. 4 is a circuit diagram illustrative of an example of the structure of the main part of a semiconductor device according to a second embodiment.
Figure 5:
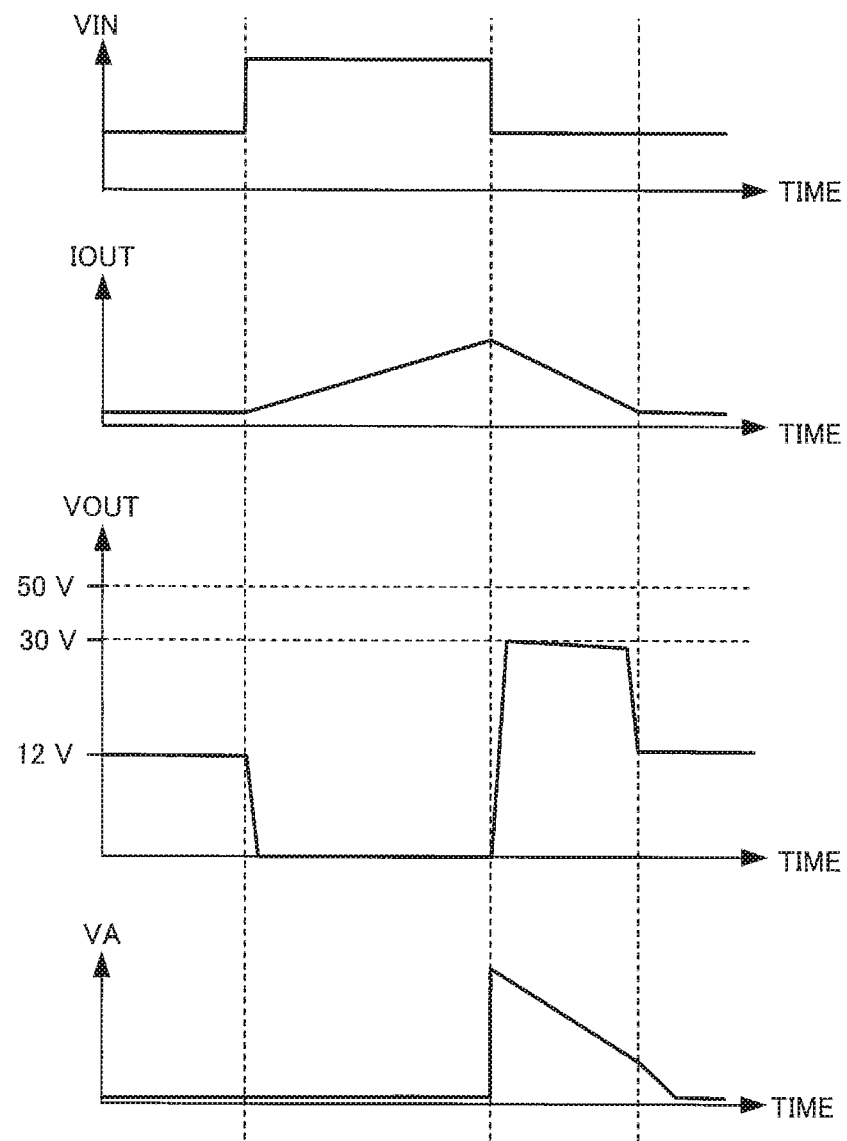
FIG. 5 illustrates the operational waveform of the semiconductor device according to the second embodiment.
Figure 6:
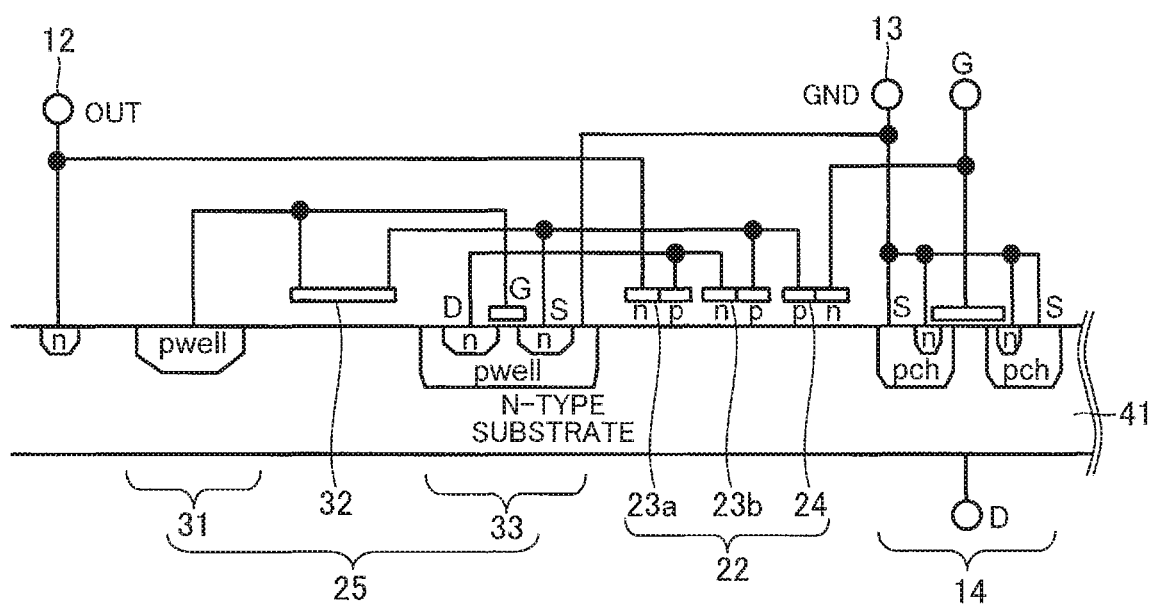
FIG. 6 is a sectional view illustrative of the structure of each element of the semiconductor device according to the second embodiment.

FIG. 4 is a circuit diagram illustrative of an example of the structure of the main part of a semiconductor device according to a second embodiment. FIG. 5 illustrates the operational waveform of the semiconductor device according to the second embodiment. FIG. 6 is a sectional view illustrative of the structure of each element of the semiconductor device according to the second embodiment. Components in FIG. 4 which are the same as or equivalent to those illustrated in FIG. 1 are marked with the same numerals and detailed descriptions of them will be omitted. Furthermore, in FIG. 4, the protective circuit including the overheat detection circuit 17 and the overcurrent detection circuit 18 is omitted from the semiconductor device 1 illustrated in FIG. 1 and only an input resistor 27 is illustrated in the control circuit 16 illustrated in FIG. 1.

With a semiconductor device 1a according to a second embodiment an active clamping circuit 22 includes two Zener diodes 23a and 23b connected in series and a diode 24. The cathode terminal of the Zener diode 23a is connected to the drain terminal of a power semiconductor element 14 (output terminal 12) and the anode terminal of the Zener diode 23a is connected to the cathode terminal of the Zener diode 23b. The anode terminal of the Zener diode 23b is connected to the anode terminal of the diode 24 and the cathode terminal of the diode 24 is connected to the gate terminal of the power semiconductor element 14. A Zener diode having a Zener voltage of 30 V is used as the Zener diode 23a and a Zener diode having a Zener voltage of 20 V is used as the Zener diode 23b. Accordingly, the clamp voltage of the active clamping circuit 22 is 50 V.

A clamp voltage switching circuit 25 includes a capacitor 31, a resistor 32, and a switching element 33. An n-type MOSFET is used as the switching element 33. One terminal of the capacitor 31 is connected to the drain terminal of the power semiconductor element 14 (output terminal 12) and the other terminal of the capacitor 31 is connected to a connection point A of one terminal of the resistor 32 and the gate terminal of the switching element 33. The other terminal of the resistor 32 is connected to the source terminal of the switching element 33. The drain terminal of the switching element 33 is connected to the common connection point of the Zener diodes 23a and 23b of the active clamping circuit 22. The source terminal of the switching element 33 is connected to the common connection point of the Zener diode 23b and the diode 24 of the active clamping circuit 22.

As illustrated in FIG. 5, when a low-level voltage signal is inputted to an input terminal 11 and the power semiconductor element 14 turns off, the voltage of the output terminal 12 is equal to the voltage of a battery 3. At this time a voltage VA of the connection point A in the clamp voltage switching circuit 25 is at a ground level because a voltage VOUT does not change.

When a high-level voltage signal is inputted to the input terminal 11 and the power semiconductor element 14 turns on, the voltage VOUT of the output terminal 12 drops to the ground level and a current IOUT flowing through an inductive load 2 gradually increases. At this time the voltage VA of the connection point A in the clamp voltage switching circuit 25 is at the ground level because the voltage VOUT remains at the ground level and does not change.

When a low-level voltage signal is inputted to the input terminal 11 and the power semiconductor element 14 turns off, the inductive load 2 makes an attempt to continue passing the current IOUT. As a result, a counter-electromotive voltage is generated across the inductive load 2 and is applied to the output terminal 12. At this time a circuit from the output terminal 12, through the capacitor 31, the resistor 32, the diode 24, and the gate capacitance of the power semiconductor element 14, to a ground terminal 13 is formed in the semiconductor device 1a. As a result, when the voltage VOUT of the output terminal 12 rises sharply, the voltage VA of the connection point A in the clamp voltage switching circuit 25 also rises sharply and the switching element 33 turns on. Accordingly, the switching element 33 short-circuits the Zener diode 23b having a Zener voltage of 20 V and switches the clamp voltage of the active clamping circuit 22 from 50 V to 30 V.

When the voltage VOUT of the output terminal 12 is clamped at 30 V by the active clamping circuit 22, the power semiconductor element 14 turns on and the counter-electromotive voltage generated by the inductive load 2 is utilized by the power semiconductor element 14. After the counter-electromotive voltage generated by the inductive load 2 is utilized, the voltage VOUT of the output terminal 12 returns to the voltage of the battery 3. After that, the voltage VOUT of the output terminal 12 does not change. As a result, the voltage VA of the connection point A in the clamp voltage switching circuit 25 returns to the ground level. Therefore, a time constant determined by the capacitor 31 and the resistor 32 of the clamp voltage switching circuit 25 is set to a value greater than a time for which the counter-electromotive voltage generated by the inductive load 2 is utilized.

Each element of the above semiconductor device 1a has a structure illustrated in FIG. 6. According to the sectional view illustrative of the structure of each element of the semiconductor device 1a, the power semiconductor element 14 is a vertical power MOSFET formed in an n-type substrate 41. The Zener diodes 23a and 23b and the diode 24 of the active clamping circuit 22 are polysilicon diodes formed over an upper surface of the n-type substrate 41. With the clamp voltage switching circuit 25, the capacitor 31 is realized by the pn junction capacitor of a diode, the resistor 32 is a polysilicon resistor formed over the upper surface of the n-type substrate 41, and the switching element 33 is realized by an n-type MOSFET formed on the upper surface side of the n-type substrate 41.

The diode that acts as the capacitor 31 of the clamp voltage switching circuit 25 is formed of a p-well formed on the upper surface side of the n-type substrate 41 and the n-type substrate 41. Furthermore, because the switching element 33 is an n-type MOSFET, a p-well is formed on the upper surface side of the n-type substrate 41, the n-type MOSFET is formed on the upper surface side of the p-well, and the p-well is connected to the ground terminal 13.

Modification of Second Embodiment

Figure 7:
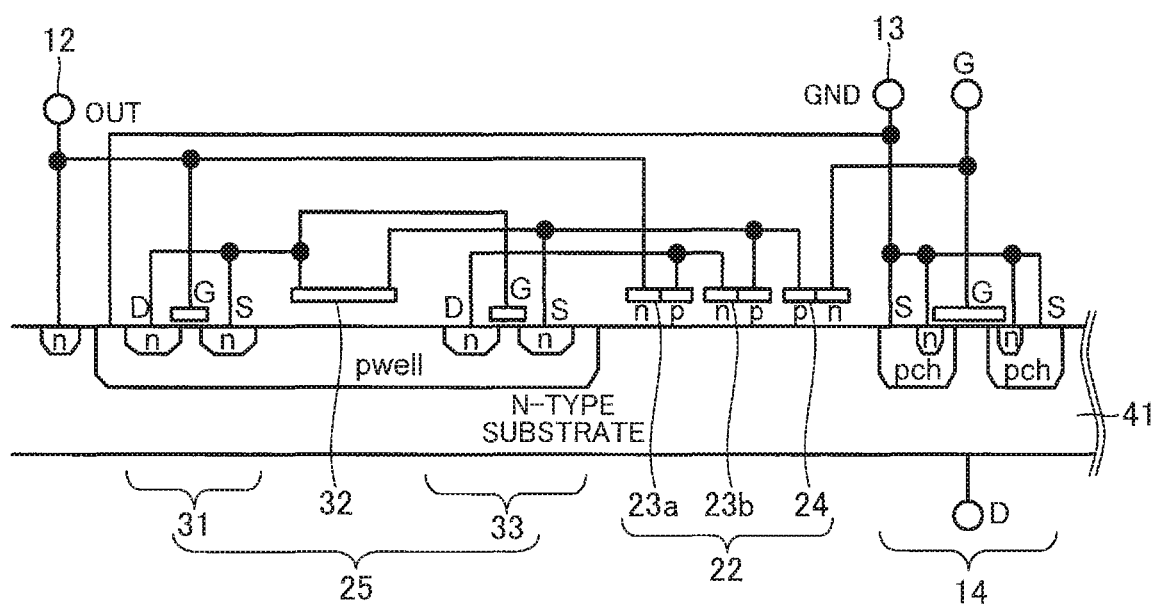
FIG. 7 is a sectional view illustrative of a modification of the structure of each element of the semiconductor device according to the second embodiment.

FIG. 7 is a sectional view illustrative of a modification of the structure of each element of the semiconductor device according to the second embodiment. Components in FIG. 7 which are the same as or equivalent to those illustrated in FIG. 6 are marked with the same numerals and detailed descriptions of them will be omitted.

According to the structure of each element illustrated in FIG. 7, a capacitor 31 of a clamp voltage switching circuit 25 is realized by an n-type MOSFET. That is to say, the n-type MOSFET that acts as the capacitor 31 is formed on the upper surface side of a p-well. This is the same with an n-type MOSFET used as a switching element 33. The drain terminal and the source terminal of the n-type MOSFET are connected. As a result, a combined capacitance value of the gate-source capacitor and the gate-drain capacitor of the n-type MOSFET is the capacitance value of the capacitor 31.

Third Embodiment

Figure 8:
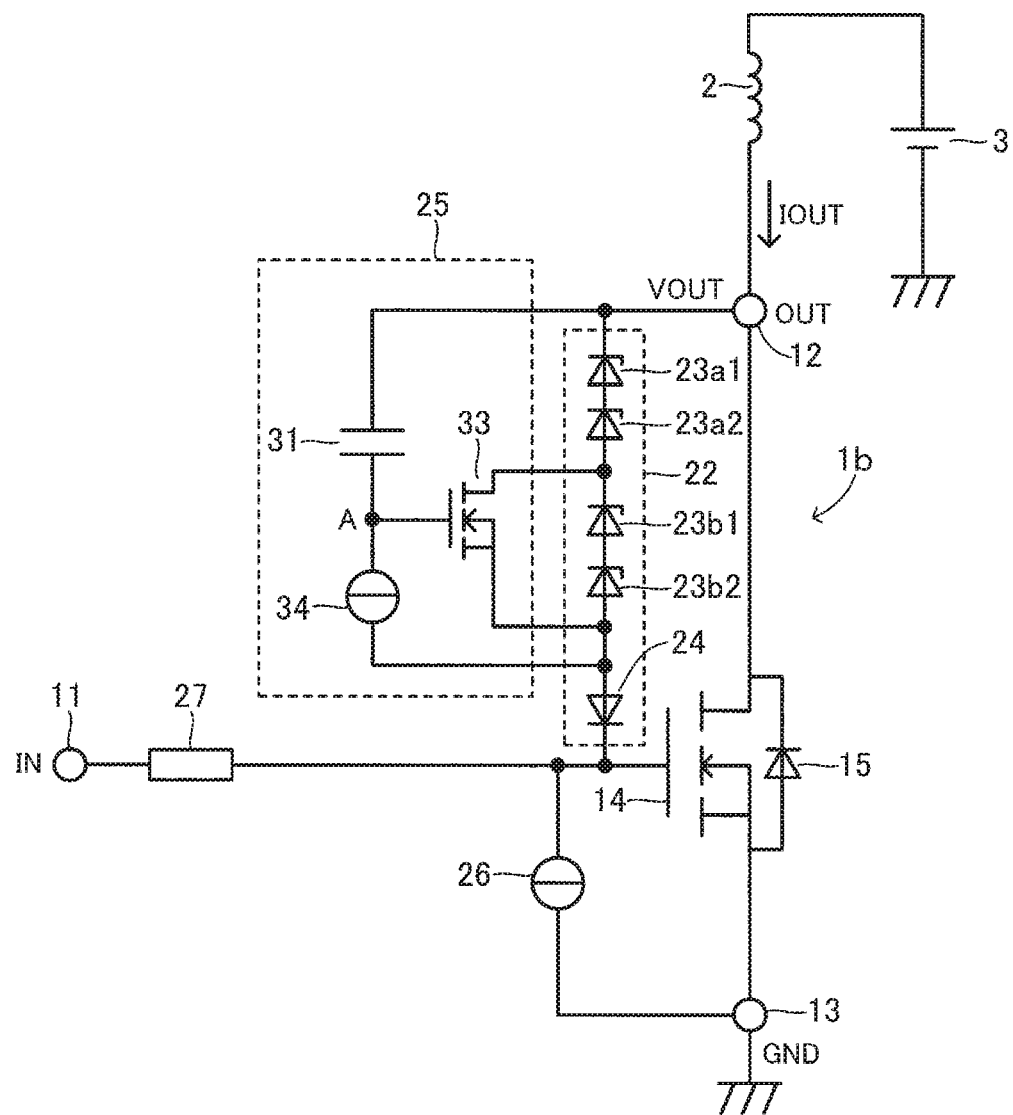
FIG. 8 is a circuit diagram illustrative of an example of the structure of the main part of a semiconductor device according to a third embodiment.
Figure 9:
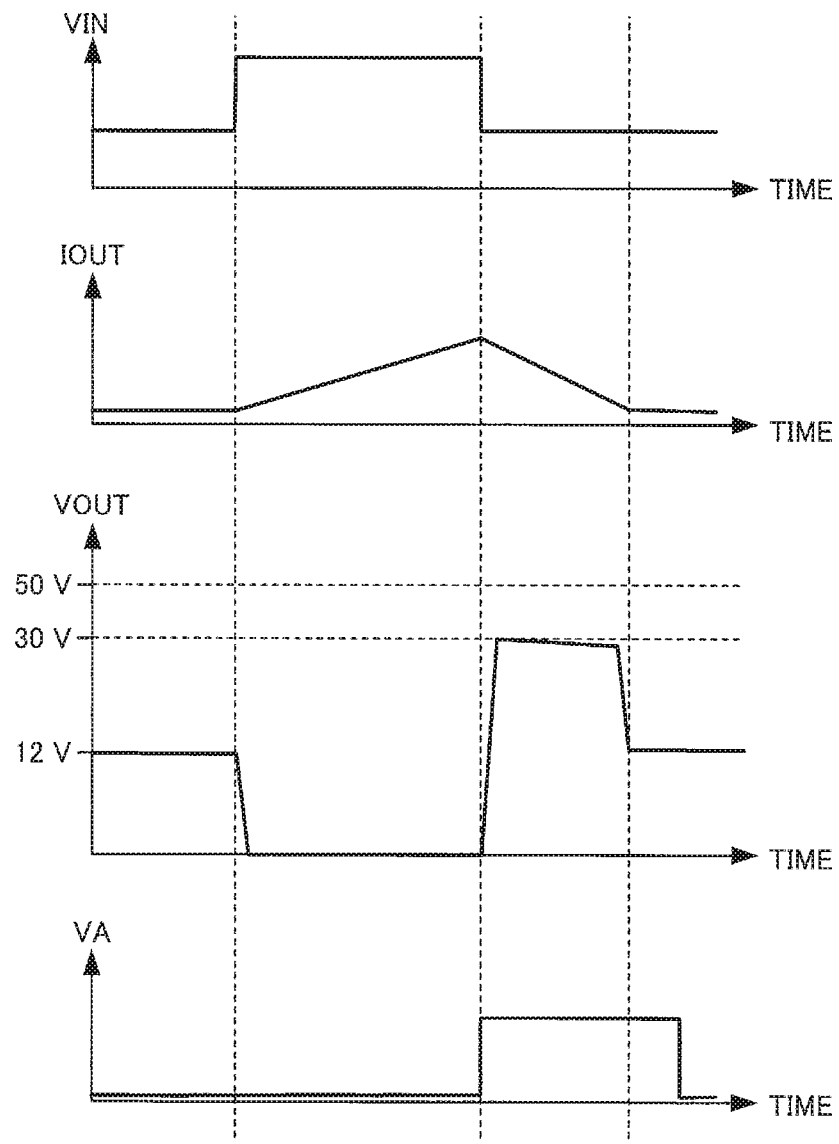
FIG. 9 illustrates the operational waveform of the semiconductor device according to the third embodiment.
Figure 10:
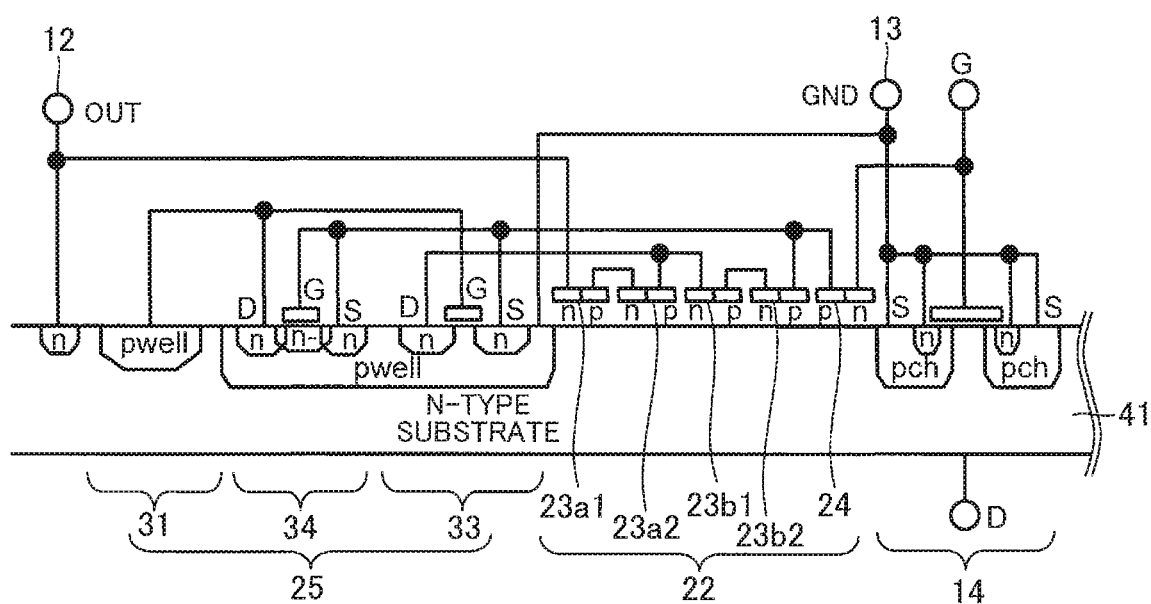
FIG. 10 is a sectional view illustrative of the structure of each element of the semiconductor device according to the third embodiment.

FIG. 8 is a circuit diagram illustrative of an example of the structure of the main part of a semiconductor device according to a third embodiment. FIG. 9 illustrates the operational waveform of the semiconductor device according to the third embodiment. FIG. 10 is a sectional view illustrative of the structure of each element of the semiconductor device according to the third embodiment. Components in FIG. 8 which are the same as or equivalent to those illustrated in FIG. 4 are marked with the same numerals and detailed descriptions of them will be omitted.

As illustrated in FIG. 8, a semiconductor device 1*b* according to a third embodiment differs from the semiconductor device 1*a* according to the second embodiment in the structure of an active clamping circuit 22 and a clamp voltage switching circuit 25. That is to say, with the active clamping circuit 22, a plurality of (two in the example of FIG. 8) Zener diodes 23*a*1 and 23*a*2 are connected in series to form a 30 volt Zener diode. Furthermore, a plurality of (two in the example of FIG. 8) Zener diodes 23*b*1 and 23*b*2 are connected in series to form a 20 volt Zener diode. The clamp voltage switching circuit 25 includes a capacitor 31, a constant-current element 34, and a switching element 33. One terminal of the capacitor 31 is connected to the drain terminal of a power semiconductor element 14 (output terminal 12) and the other terminal of the capacitor 31 is connected to a connection point A of one terminal of the constant-current element 34 and the gate terminal of the switching element 33. The other terminal of the constant-current element 34 is connected to the source terminal of the switching element 33. The drain terminal of the switching element 33 is connected to the common connection point of the Zener diodes 23*a*2 and 23*b*1 of the active clamping circuit 22. The source terminal of the switching element 33 is connected to the common connection point of the Zener diode 23*b*2 and a diode 24 of the active clamping circuit 22.

As illustrated in FIG. 9, when a low-level voltage signal is inputted to an input terminal 11 and the power semiconductor element 14 turns off, the voltage of a battery 3 is applied to the output terminal 12. At this time a voltage VA of the connection point A in the clamp voltage switching circuit 25 is at a ground level because a voltage VOUT does not change.

When a high-level voltage signal is inputted to the input terminal 11 and the power semiconductor element 14 turns on, the voltage VOUT of the output terminal 12 drops to the ground level and a current IOUT flowing through an inductive load 2 gradually increases. At this time the voltage VA of the connection point A in the clamp voltage switching circuit 25 is at the ground level because the voltage VOUT does not change.

When a low-level voltage signal is inputted to the input terminal 11 and the power semiconductor element 14 turns off, a counter-electromotive voltage generated across an inductive load 2 is applied to the output terminal 12. As a result, the voltage VOUT of the output terminal 12 rises sharply. Therefore, the voltage VA of the connection point A in the clamp voltage switching circuit 25 also rises sharply and the switching element 33 turns on. As a result, the switching element 33 short-circuits the Zener diode 23*b*1 and the Zener diode 23*b*2, and switches the clamp voltage of the active clamping circuit 22 from 50 V to 30 V. The Zener diodes 23*b*1 and 23*b*2 are connected in series and form a Zener diode having a Zener voltage of 20 V.

When the voltage VOUT of the output terminal 12 is clamped at 30 V by the active clamping circuit 22 and the power semiconductor element 14 utilizes the counter-electromotive voltage generated by the inductive load 2, the voltage VOUT of the output terminal 12 returns to the voltage of the battery 3. After that, electric charges stored in the capacitor 31 are discharged by the constant-current element 34. As a result, the voltage VA of the connection point A in the clamp voltage switching circuit 25 returns to the ground level.

The structure of each element of the semiconductor device 1*b* is illustrated in, for example, FIG. 10. According to the structure illustrated in FIG. 10, the capacitor 31 of the clamp voltage switching circuit 25 is realized by the pn junction capacitor of a diode. The constant-current element 34 of the clamp voltage switching circuit 25 is realized by connecting the gate terminal and the source terminal of a depletion-type and n-type MOSFET. The drain terminal of the depletion-type and n-type MOSFET is connected to the connection point A. The gate terminal and the source terminal of the depletion-type and n-type MOSFET are connected to the source terminal of the switching element 33.

The capacitor 31 of the clamp voltage switching circuit 25 is realized by the pn junction capacitor of a diode. As illustrated in FIG. 7, however, a combined capacitance value of the gate-source capacitor and the gate-drain capacitor of an n-type MOSFET may be the capacitance value of the capacitor 31.

Fourth Embodiment

Figure 11:
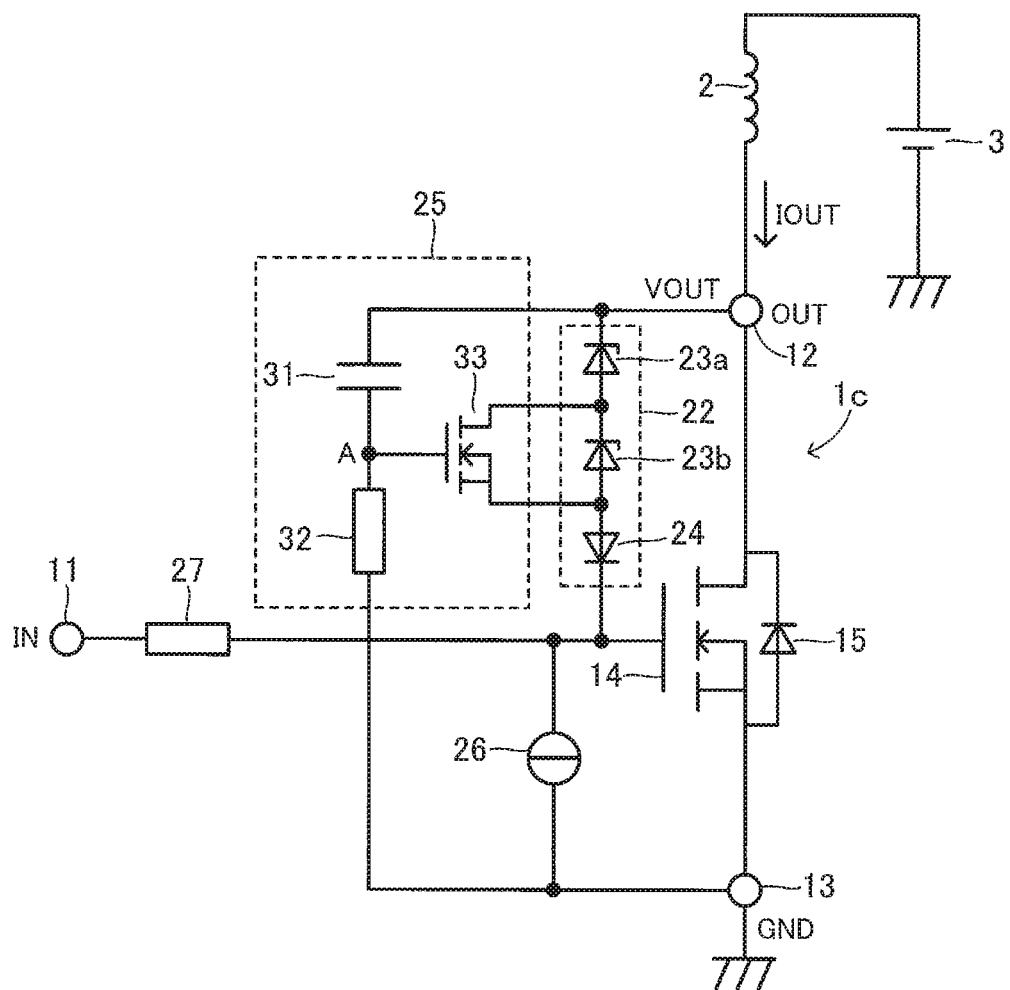
FIG. 11 is a circuit diagram illustrative of an example of the structure of the main part of a semiconductor device according to a fourth embodiment.
Figure 12:
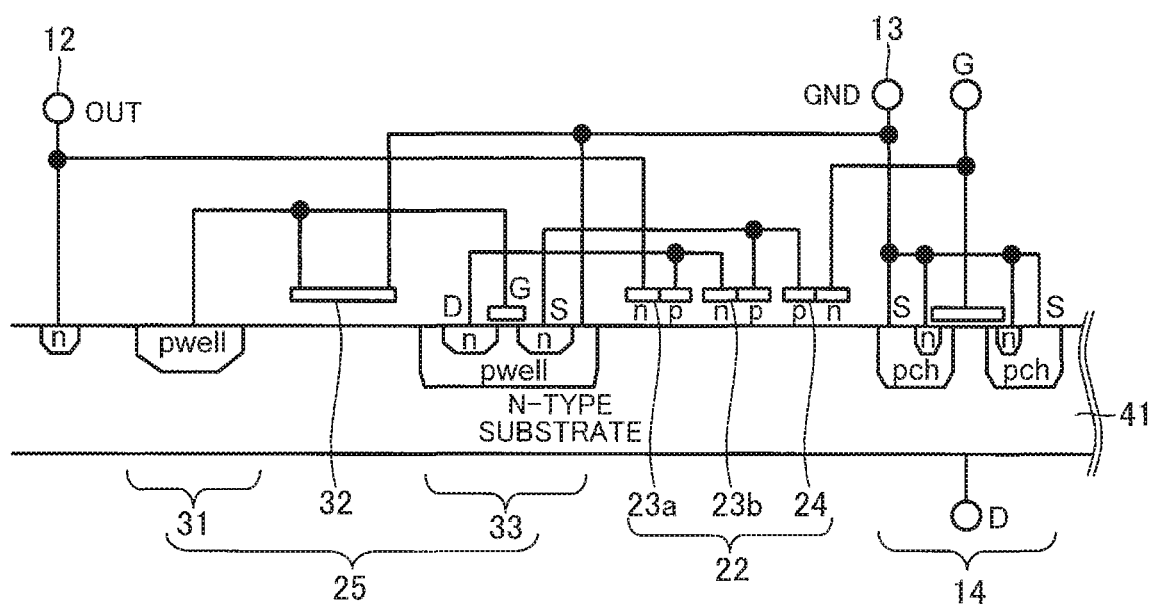
FIG. 12 is a sectional view illustrative of the structure of each element of the semiconductor device according to the fourth embodiment.

FIG. 11 is a circuit diagram illustrative of an example of the structure of the main part of a semiconductor device according to a fourth embodiment. FIG. 12 is a sectional view illustrative of the structure of each element of the semiconductor device according to the fourth embodiment. Components in FIG. 11 which are the same as or equivalent to those illustrated in FIG. 4 are marked with the same numerals and detailed descriptions of them will be omitted.

A semiconductor device 1*c* according to a fourth embodiment differs from the semiconductor device 1*a* according to the second embodiment in position where a resistor 32 of a clamp voltage switching circuit 25 is connected. That is to say, the other terminal of the resistor 32 is connected to the source terminal of a power semiconductor element 14 (ground terminal 13). Accordingly, the clamp voltage switching circuit 25 monitors changes in voltage between an output terminal 12 and the ground terminal 13, detects an abrupt change in voltage, and switches the clamp voltage of an active clamping circuit 22 from 50 V to 30 V.

Each element of the above semiconductor device 1*c* has a structure illustrated in FIG. 12. According to the sectional view illustrative of the structure of each element of the semiconductor device 1*c*, the structure of each element is the same as that of each element illustrated in FIG. 6. However, the other terminal of the resistor 32 is connected not to the source terminal of a switching element 33 but to the ground terminal 13.

Fifth Embodiment

Figure 13:
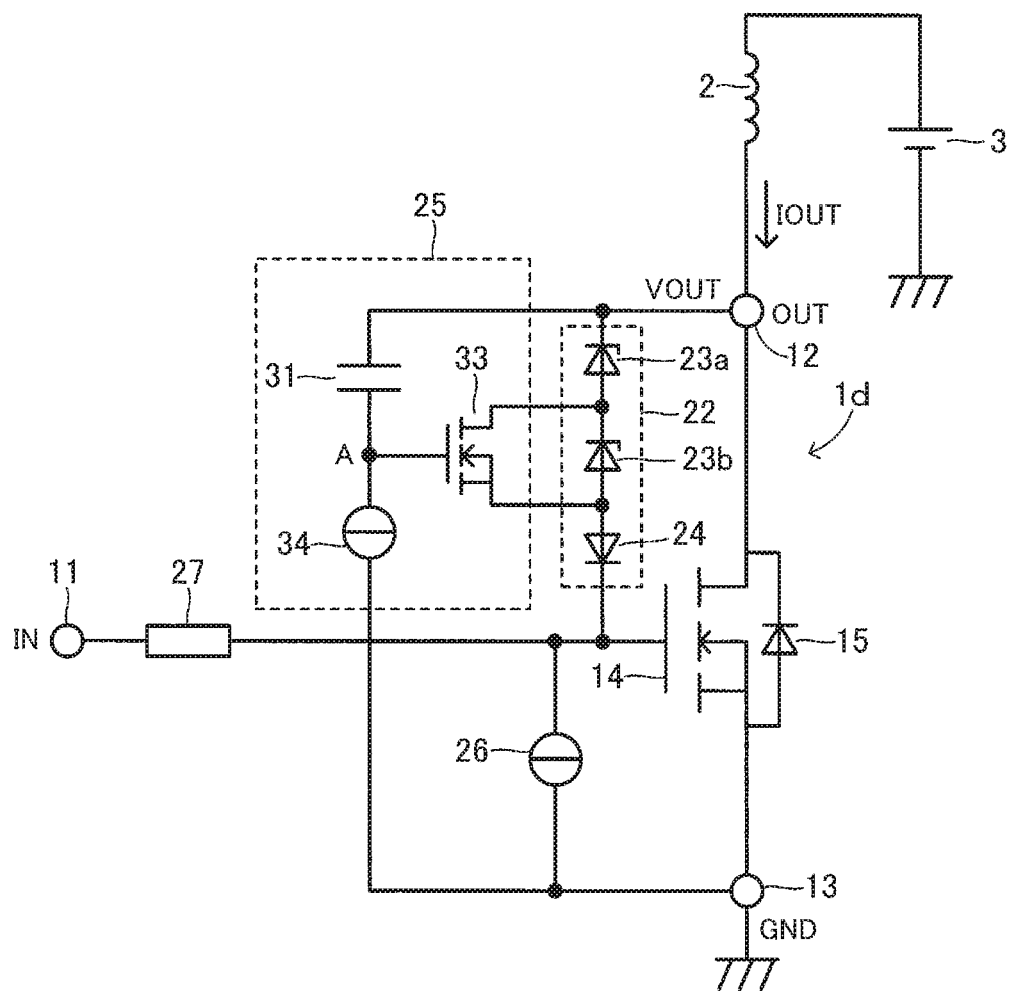
FIG. 13 is a circuit diagram illustrative of an example of the structure of the main part of a semiconductor device according to a fifth embodiment.
Figure 14:
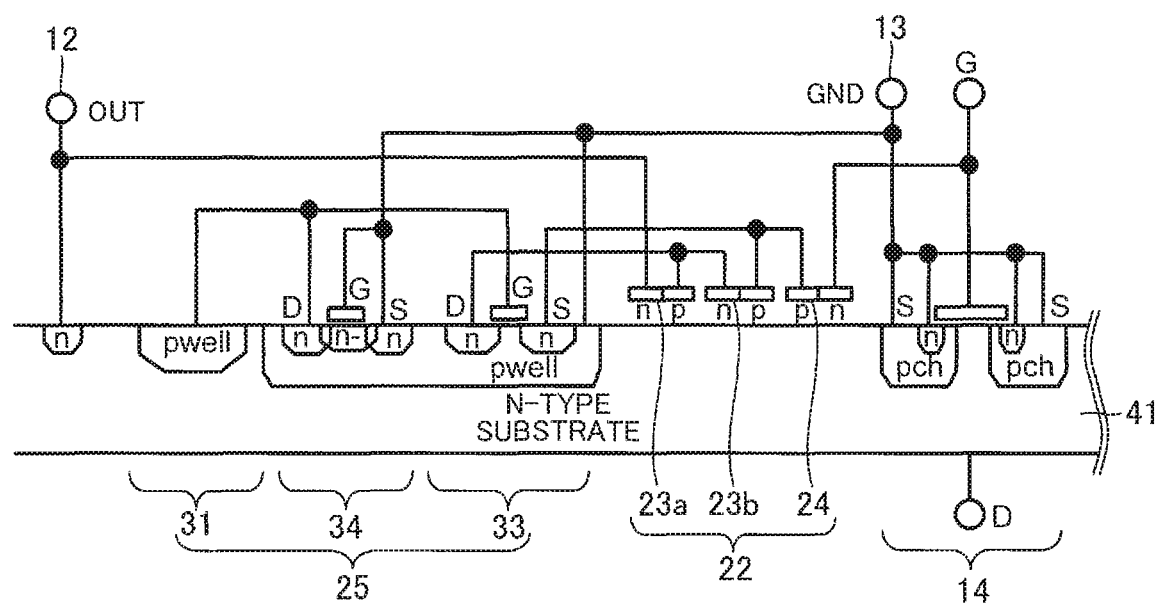
FIG. 14 is a sectional view illustrative of the structure of each element of the semiconductor device according to the fifth embodiment.

FIG. 13 is a circuit diagram illustrative of an example of the structure of the main part of a semiconductor device according to a fifth embodiment. FIG. 14 is a sectional view illustrative of the structure of each element of the semiconductor device according to the fifth embodiment. Components in FIG. 13 which are the same as or equivalent to those illustrated in FIG. 8 are marked with the same numerals and detailed descriptions of them will be omitted.

A semiconductor device 1d according to a fifth embodiment differs from the semiconductor device 1b according to the third embodiment in position where a constant-current element 34 of a clamp voltage switching circuit 25 is connected. That is to say, the other terminal of the constant-current element 34 is connected to the source terminal of a power semiconductor element 14 (ground terminal 13). Accordingly, the clamp voltage switching circuit 25 monitors changes in voltage between an output terminal 12 and the ground terminal 13, detects an abrupt change in voltage, and switches the clamp voltage of an active clamping circuit 22 from 50 V to 30 V.

Each element of the above semiconductor device 1d has a structure illustrated in FIG. 14. According to the sectional view illustrative of the structure of each element of the semiconductor device 1d, the structure of each element is the same as that of each element illustrated in FIG. 10. However, the gate terminal and the source terminal of a depletion-type and n-type MOSFET that acts as the constant-current element 34 are connected to the ground terminal 13.

Sixth Embodiment

Figure 15:
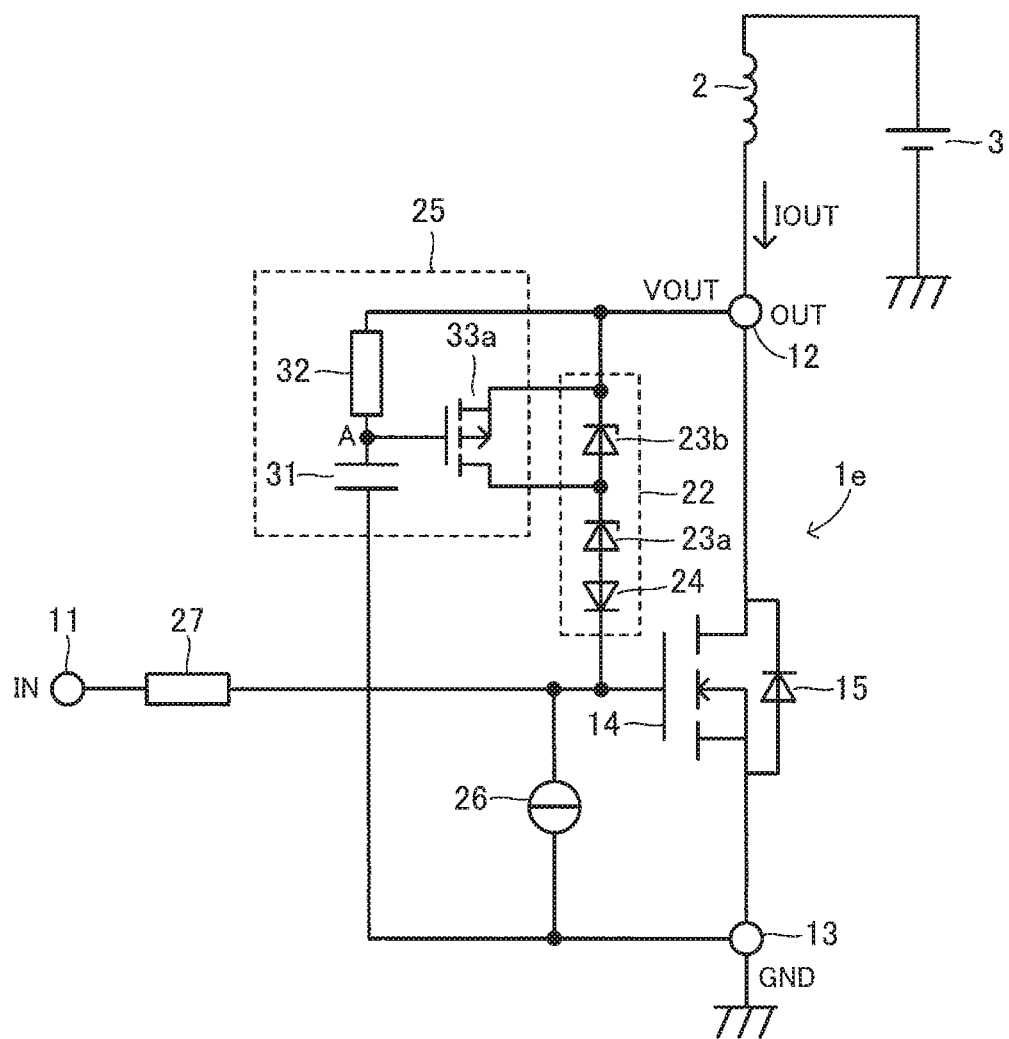
FIG. 15 is a circuit diagram illustrative of an example of the structure of the main part of a semiconductor device according to a sixth embodiment.
Figure 16:
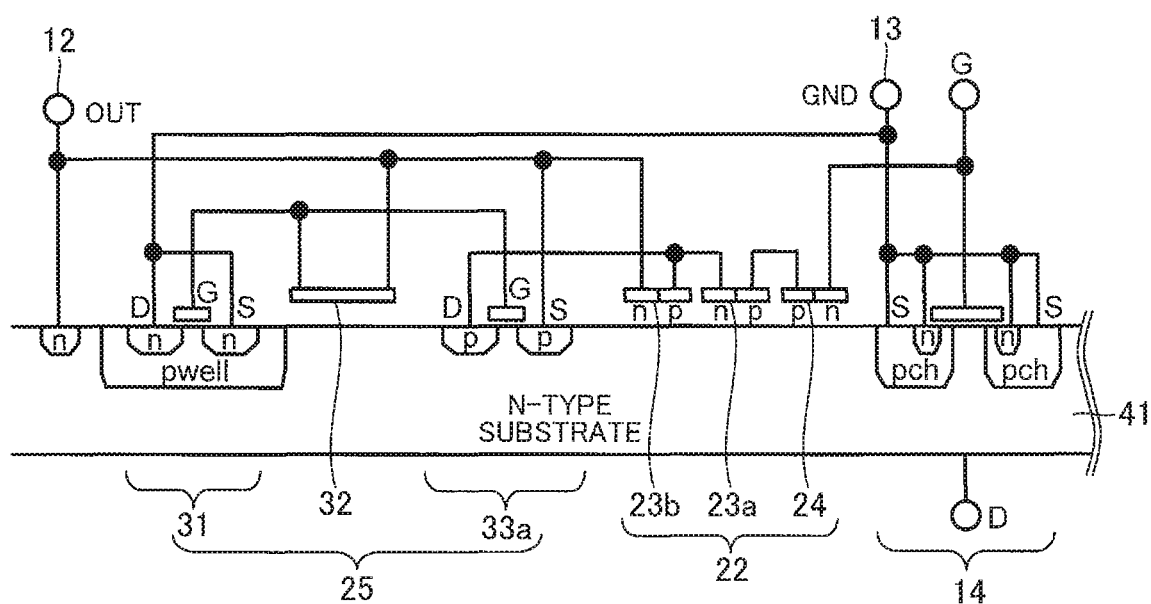
FIG. 16 is a sectional view illustrative of the structure of each element of the semiconductor device according to the sixth embodiment.
Figure 17:
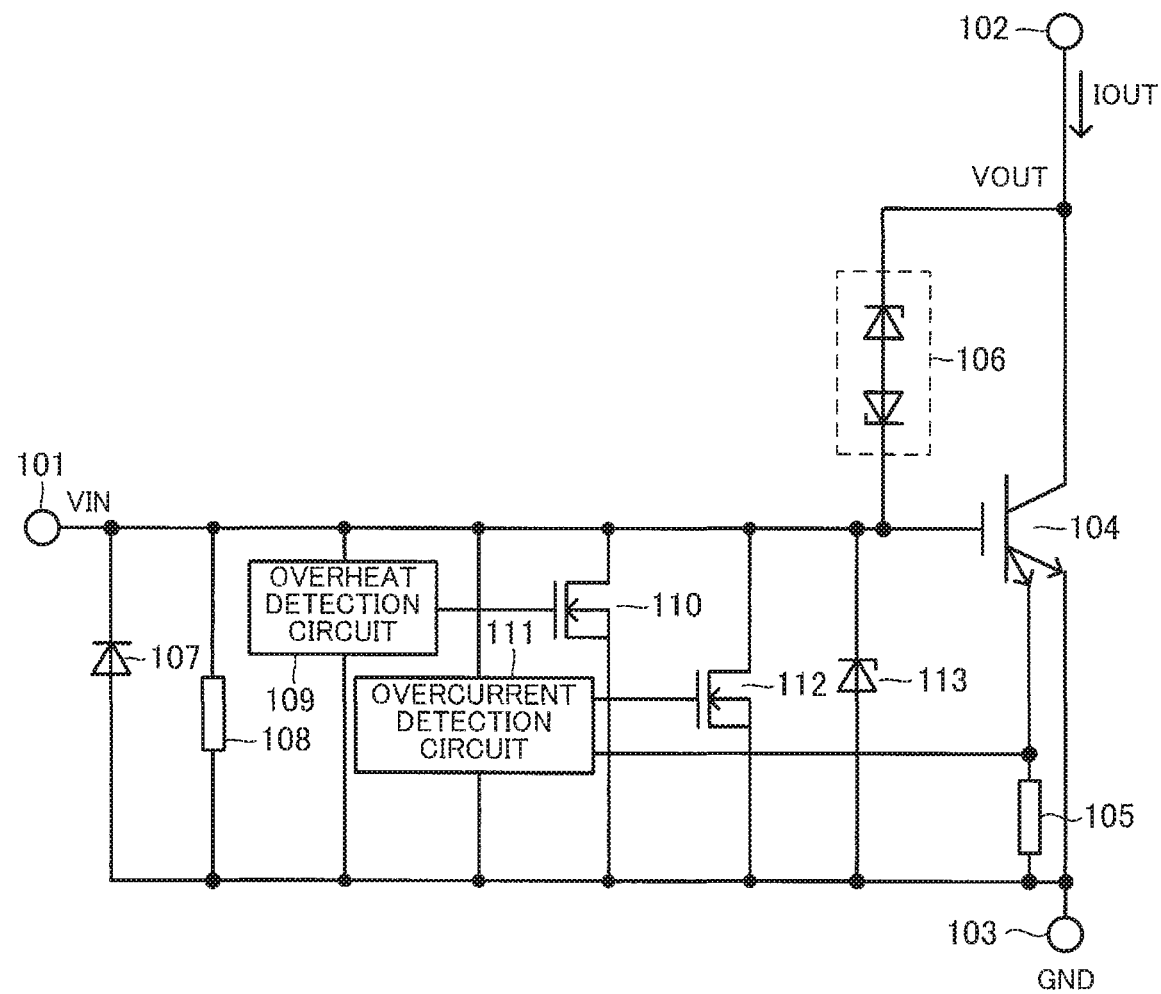
FIG. 17 is a circuit diagram illustrative of an example of the structure of a conventional semiconductor device.
Figure 18:
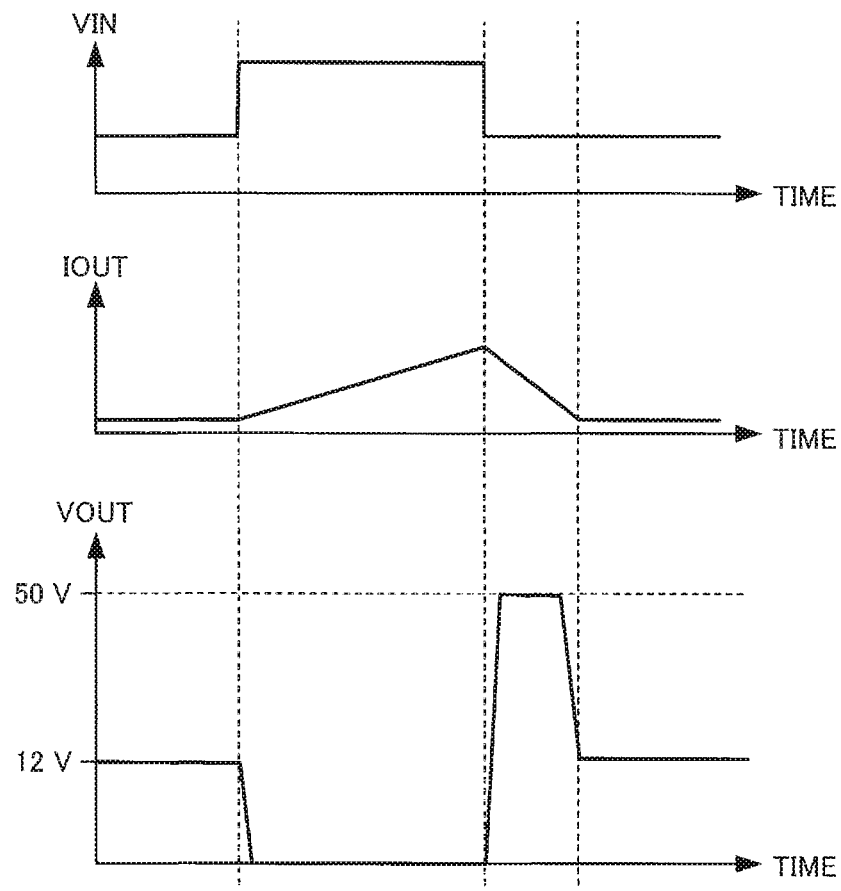
FIG. 18 illustrates the operational waveforms of the semiconductor device obtained at the time of applying an active clamping circuit.

FIG. 15 is a circuit diagram illustrative of an example of the structure of the main part of a semiconductor device according to a sixth embodiment. FIG. 16 is a sectional view illustrative of the structure of each element of the semiconductor device according to the sixth embodiment. Components in FIG. 15 which are the same as or equivalent to those illustrated in FIG. 4 are marked with the same numerals and detailed descriptions of them will be omitted.

A semiconductor device 1e according to a sixth embodiment differs from the semiconductor device 1c according to the fourth embodiment in that the positions of Zener diodes 23a and 23b of its active clamping circuit 22 connected in series are reversed. That is to say, the cathode terminal of the Zener diode 23b having a Zener voltage of 20 V is connected to the drain terminal of a power semiconductor element 14 (output terminal 12). The anode terminal of the Zener diode 23b is connected to the cathode terminal of the Zener diode 23a having a Zener voltage of 30 V. Furthermore, the anode terminal of the Zener diode 23a is connected to the anode terminal of a diode 24.

A clamp voltage switching circuit 25 includes a resistor 32, a capacitor 31, and a switching element 33a. A p-type MOSFET is used as the switching element 33a. One terminal of the resistor 32 is connected to the drain terminal of the power semiconductor element 14 (output terminal 12) and the other terminal of the resistor 32 is connected to a connection point A of one terminal of the capacitor 31 and the gate terminal of the switching element 33a. The other terminal of the capacitor 31 is connected to the source terminal of the power semiconductor element 14 (ground terminal 13). The source terminal of the switching element 33a is connected to the cathode terminal of the Zener diode 23b of the active clamping circuit 22. The drain terminal of the switching element 33a is connected to the common connection point of the Zener diodes 23a and 23b of the active clamping circuit 22.

When the power semiconductor element 14 in an on state is turned off in the semiconductor device 1e, the clamp voltage switching circuit 25 detects a counter-electromotive voltage generated across an inductive load 2. This is the same with the semiconductor device 1c according to the fourth embodiment. As a result, the clamp voltage switching circuit 25 turns on the switching element 33a, short-circuits the Zener diode 23b having a Zener voltage of 20 V, and switches the clamp voltage of the active clamping circuit 22 from 50 V to 30 V. The counter-electromotive voltage generated across an inductive load 2 is utilized by the power semiconductor element 14 and a voltage VOUT of the output terminal 12 is clamped at 30 V.

The structure of each element of the semiconductor device 1e is as follows. As illustrated in FIG. 16, the switching element 33a is realized by a p-type MOSFET formed on the upper surface side of an n-type substrate 41. The capacitor 31 is realized by an n-type MOSFET formed on the upper surface side of a p-well formed in the n-type substrate 41. This is the same with the structure illustrated in FIG. 7. A combined capacitance value of the gate-source capacitor and the gate-drain capacitor of the n-type MOSFET is the capacitance value of the capacitor 31. The drain terminal and the source terminal of the n-type MOSFET that act as the capacitor 31 are connected to the ground terminal 13.

The other terminal of the capacitor 31 may be connected to the drain terminal of the switching element 33a instead of being connected to the source terminal of the power semiconductor element 14 (ground terminal 13).

Furthermore, in the above embodiments a case where a MOSFET is used as the power semiconductor element 14 is described. However, an IGBT or a freewheeling diode may be used as the power semiconductor element 14.

With the semiconductor devices each having the above structure, switching to a low clamp voltage is performed only at the time of the operation of the active clamping circuit caused by a counter-electromotive voltage generated by the inductive load. This offers the advantage that a clamp resistance will increase and that a rise in the temperature of the power semiconductor element will be suppressed. However, the clamp voltage of the semiconductor device relative to a DC voltage not caused by a counter-electromotive voltage generated by the inductive load is maintained because the active clamping circuit sets the clamp voltage of the semiconductor device to a high clamp voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device having an input terminal and an output terminal, the semiconductor device comprising:
   a power semiconductor element having
      a first main terminal connected to the output terminal of the semiconductor device,
      a second main terminal connected to the ground, and
      a gate terminal;
   an active clamping circuit including a Zener diode and a diode connected in inverse series between the gate terminal and the first main terminal of the power semiconductor element; and a clamp voltage switching circuit connected to the active clamping circuit and the output terminal of the semiconductor device, the clamp voltage switching circuit being configured to switch a clamp voltage of the active clamping circuit according to a change in a voltage of the output terminal relative to the ground at a time when the power semiconductor element is turned off, the clamp voltage being switched to a first clamp voltage when the change in the voltage is not positive, and a second clamp voltage lower than the first clamp voltage when the change in the voltage is positive.

2. The semiconductor device according to claim 1, wherein:

the Zener diode of the active clamping circuit is made up of a first Zener diode and a second Zener diode which are connected in series and have a total Zener voltage equal to the first clamp voltage; and one of the first Zener diode and the second Zener diode has a Zener voltage equal to the second clamp voltage.

3. The semiconductor device according to claim 2, wherein at least one of the first Zener diode and the second Zener diode is made up of a plurality of Zener diodes connected in series.

4. The semiconductor device according to claim 2, wherein the clamp voltage switching circuit includes:

a circuit including a capacitor and one of a resistor and a constant-current element that is connected in series with the capacitor, the circuit being connected in parallel with the first Zener diode and the second Zener diode connected in series; and a switching element connected to a connection point of the capacitor and the resistor or the constant-current element, and to one of the first Zener diode and the second Zener diode, which is short-circuitable by the switching element.

5. The semiconductor device according to claim 4, wherein the power semiconductor element and the clamp voltage switching circuit are formed in an n-type substrate.

6. The semiconductor device according to claim 5, wherein the capacitor is realized by a pn junction capacitor of another diode formed in the n-type substrate.

7. The semiconductor device according to claim 5, wherein the capacitor includes a metal-oxide-semiconductor field-effect transistor (MOSFET) formed in the n-type substrate, and a capacitance value of the capacitor is equal to a combined capacitance value of a gate-source capacitor and a gate-drain capacitor of the MOSFET.

8. The semiconductor device according to claim 5, wherein the resistor is a polysilicon resistor formed on an upper surface of the n-type substrate.

9. The semiconductor device according to claim 5, wherein the constant-current element includes a depletion-type metal-oxide-semiconductor field-effect transistor (MOSFET) formed in the n-type substrate, the depletion-type MOSFET having a gate terminal and a source terminal connected to each other.

10. The semiconductor device according to claim 2, wherein the clamp voltage switching circuit includes:

a circuit including a capacitor and one of a resistor and a constant-current element that is connected in series with the capacitor, the circuit being connected to the first main terminal and the second main terminal of the power semiconductor element; and a switching element connected to a connection point of the capacitor and the resistor or the constant-current element, and to one of the first Zener diode and the second Zener diode, which is short-circuitable by the switching element.

11. The semiconductor device according to claim 10, wherein the power semiconductor element and the clamp voltage switching circuit are formed in an n-type substrate.

12. The semiconductor device according to claim 11, wherein the capacitor is realized by a pn junction capacitor of another diode formed in the n-type substrate.

13. The semiconductor device according to claim 11, wherein the capacitor includes a metal-oxide-semiconductor field-effect transistor (MOSFET) formed in the n-type substrate, and a capacitance value of the capacitor is equal to a combined capacitance value of a gate-source capacitor and a gate-drain capacitor of the MOSFET.

14. The semiconductor device according to claim 11, wherein the resistor is a polysilicon resistor formed on an upper surface of the n-type substrate.

15. The semiconductor device according to claim 11, wherein the constant-current element includes a depletion-type metal-oxide-semiconductor field-effect transistor (MOSFET) formed in the n-type substrate, and the depletion-type MOSFET having a gate terminal and a source terminal connected to each other.

16. The semiconductor device according to claim 1, further comprising another diode connected in inverse parallel with the power semiconductor element, wherein the first clamp voltage is lower than a breakdown voltage of said another diode.

* * * * *